(12) United States Patent
Ichinokura et al.

(10) Patent No.: US 8,189,638 B2
(45) Date of Patent: May 29, 2012

(54) LASER DIODE DEVICE

(75) Inventors: Hiroyasu Ichinokura, Miyagi (JP);
Masaru Kuramoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 55 days.

(21) Appl. No.: 12/717,483

(22) Filed: Mar. 4, 2010

(65) Prior Publication Data

US 2010/0232466 A1    Sep. 16, 2010

(30) Foreign Application Priority Data

Mar. 11, 2009    (JP) ................................ 2009-058249

(51) Int. Cl.
*H01S 5/00*    (2006.01)

(52) U.S. Cl. .................. 372/45.01; 372/46.01

(58) Field of Classification Search ............... 372/45.01, 372/46.01
See application file for complete search history.

(56) References Cited

U.S. PATENT DOCUMENTS

| | | | |
|---|---|---|---|
| 2003/0213969 A1* | 11/2003 | Wang et al. | 257/98 |
| 2005/0269584 A1* | 12/2005 | Hasegawa et al. | 257/94 |
| 2008/0291960 A1* | 11/2008 | Inoue et al. | 372/45.01 |

FOREIGN PATENT DOCUMENTS

JP    2007-150371    6/2007

OTHER PUBLICATIONS

T. Takeuchi et al.; Improvement of far-field pattern in nitride laser diodes; Applied Physics Letters; vol. 75, No. 19; Nov. 8, 1999.
Shiro Uchida et al.; Recent Progress in High-Power Blue-Violet Lasers; IEEE Journal of Selected Topics in Quantum Electronics; vol. 9; p. 1252-1259; 2003.
Valerio Laino et al.; Substrate Modes of 9A1,In)GaN Semiconductor Laser Diodes on SiC and GaN Substrates; IEEE Journal of Quantum Electronics; vol. 43, No. 1; Jan. 2007.
M. Kuramoto et al; Reduction of Internal Loss and Threshold Current in a Laser Diode with a Ridge by Selective Re-Growth (RiS-LD); phys. stat sol. 9a); 192, No. 2, 329-334; 2002.
Hideyoshi Horie et al.; Longitudinal-Mode Characteristics of Weakly Index-Guided Buried-Stripe Type 980-nm Laser Diodes with and witout Substrate-Mode Induced Phonomena; IEEE Journal of Quantum Electronics; vol. 36, No. 12; Dec. 2006.
S. Einfeldt et al.; Strain relaxation in AlGaN under tensile plane stress; Journal of Applied Physics; vol. 88, No. 12; Dec. 15, 2000.

* cited by examiner

*Primary Examiner* — Yuanda Zhang
(74) *Attorney, Agent, or Firm* — SNR Denton US LLP

(57) ABSTRACT

A laser diode device comprises an n-type cladding layer containing aluminum (Al); an active layer containing indium (In), gallium (Ga) and nitrogen (N); and a codoped layer that is provided between the substrate and the n-type cladding layer. The codoped layer is also containing gallium (Ga) and nitrogen (N), and is codoped with one of silicon (Si) and germanium (Ge) as impurity working as a donor and one of magnesium (Mg) and zinc (Zn) as impurity working as an acceptor.

7 Claims, 4 Drawing Sheets

LASER DIODE DEVICE

BACKGROUND OF THE INVENTION

1. Field of the Invention

The present invention relates to a laser diode device suitable for a light source for a high-capacity optical disc or the like.

2. Description of the Related Art

In recent years, a nitride compound laser diode device in which a sapphire substrate, a GaN substrate, an SiC substrate or the like is used has been widely used as a light source for a high-capacity optical disc, and a device with a higher output and high reliability has been progressively developed. In such a nitride compound laser diode device, optical confinement in the perpendicular direction (vertical direction) to the active layer is made by using a light guide layer and a cladding layer.

However, even if the light guide layer and the cladding layer are provided, for an AlGaN mixed crystal composing the cladding layer, the film thickness is restricted due to crack generation to the aluminum content. Thus, in some cases, the film thickness of the cladding layer is not able to be grown to a thickness sufficient for light confinement. It has been reported that in this case, part of light generated in the active layer is exuded to the substrate side, and ripple is observed in FFP (Far Field Pattern) (for example, refer to "Applied Physics Letters," 1999, Vol. 75, No. 19, pp. 2960-2962 (FIG. 5) and "IEEE Journal of Selected Topics in Quantum Electronics," 2003, September/October, Vol. 9, No. 5, pp. 1252-1259 (FIG. 9)). Further, the light exuded to the substrate side generates mode coupling with light wave-guided through the active layer, which not only lowers light collection characteristics but also affects laser characteristics (for example, refer to "IEEE Journal of Quantum Electronics," 2007, January, Vol. 43, No. 1, pp. 16-24 (lines 22 to 30 in the right column of p. 20) and "IEEE Journal of Quantum Electronics," 2000, December, Vol. 36, No. 12, pp. 1454-1461 (lines 2 to 13 in the left column of p. 1460)).

SUMMARY OF THE INVENTION

To inhibit such mode coupling, the thickness of an n-type cladding layer may be thickened. However, in the case of the nitride compound laser diode, such a method has limitations that the film thickness is restricted due to crack generation of the AlGaN mixed crystal described above.

In Japanese Unexamined Patent Application Publication No. 2007-150371 (paragraphs 0042 to 0044), only a p-side light guide layer is provided and an n-side light guide layer is omitted. Thereby, light is actively exuded to an n-type GaN substrate side, and the exuded light is absorbed by using impurity level of the n-type GaN substrate doped with oxygen. Further, in Japanese Unexamined Patent Application Publication No. 2007-150371 (paragraphs 0042 to 0044), it is described that the light amount absorbed in the n-type GaN substrate is able to be adjusted by adjusting the distance between the n-type GaN substrate and the light emitting layer (active layer).

However, in the case where the distance between the n-type GaN substrate and the light emitting layer (active layer) is decreased as in Japanese Unexamined Patent Application Publication No. 2007-150371 (paragraphs 0042 to 0044), there is a disadvantage that if the distance between the n-type GaN substrate and the light emitting layer (active layer) is only decreased, mode coupling between the light wave-guided through the light emitting layer (active layer) and the light exuded to the n-type GaN substrate side is easily generated and thus the light absorption amount is hardly adjusted.

It is desirable to provide a laser diode device with which mode coupling between the light exuded to the substrate side and the light wave-guided through the active layer is able to be inhibited.

According to an embodiment of the invention, there is provided a laser diode device including the following elements A to D:

A. a substrate composed of GaN;

B. an n-type cladding layer and a p-type cladding layer that are provided on one face side of the substrate, are composed of nitride Group III-V compound semiconductor containing at least gallium (Ga) out of Group 3B elements and at least nitrogen (N) out of Group 5B elements, and contain aluminum (Al) at least in part;

C. an active layer that is provided between the n-type cladding layer and the p-type cladding layer, and is composed of nitride Group III-V compound semiconductor containing at least indium (In) and gallium (Ga) out of Group 3B elements and at least nitrogen (N) out of Group 5B elements; and D. a codoped layer that is provided between the substrate and the n-type cladding layer, that is composed of nitride Group III-V compound semiconductor containing at least gallium (Ga) out of Group 3B elements and at least nitrogen (N) out of Group 5B elements, and that is codoped with one of silicon (Si) and germanium (Ge) as impurity working as a donor and one of magnesium (Mg) and zinc (Zn) as impurity working as an acceptor.

In the laser diode device, the codoped layer codoped with one of silicon (Si) and germanium (Ge) as impurity working as a donor and one of magnesium (Mg) and zinc (Zn) as impurity working as an acceptor is provided between the substrate and the n-type cladding layer. Thus, the light absorption coefficient of the codoped layer is significantly increased compared to a case doped with only impurity working as a donor or a case doped with only impurity working as an acceptor. Therefore, light exuded to the substrate side through the n-type cladding layer is absorbed into the codoped layer, and is decayed down to the degree with which mode coupling with light wave-guided through the active layer is not generated.

According to the laser diode device of the embodiment of the invention, the codoped layer codoped with one of silicon (Si) and germanium (Ge) as impurity working as a donor and one of magnesium (Mg) and zinc (Zn) as impurity working as an acceptor is provided between the substrate and the n-type cladding layer. Thus, light exuded to the substrate side through the n-type cladding layer is able to be absorbed into the codoped layer. Accordingly, mode coupling between light exuded to the substrate side and light wave-guided through the active layer is able to be inhibited.

Other and further objects, features and advantages of the invention will appear more fully from the following description.

DETAILED DESCRIPTION OF THE PREFERRED EMBODIMENT

An embodiment of the invention will be hereinafter described in detail with reference to the drawings.

Figure 1:
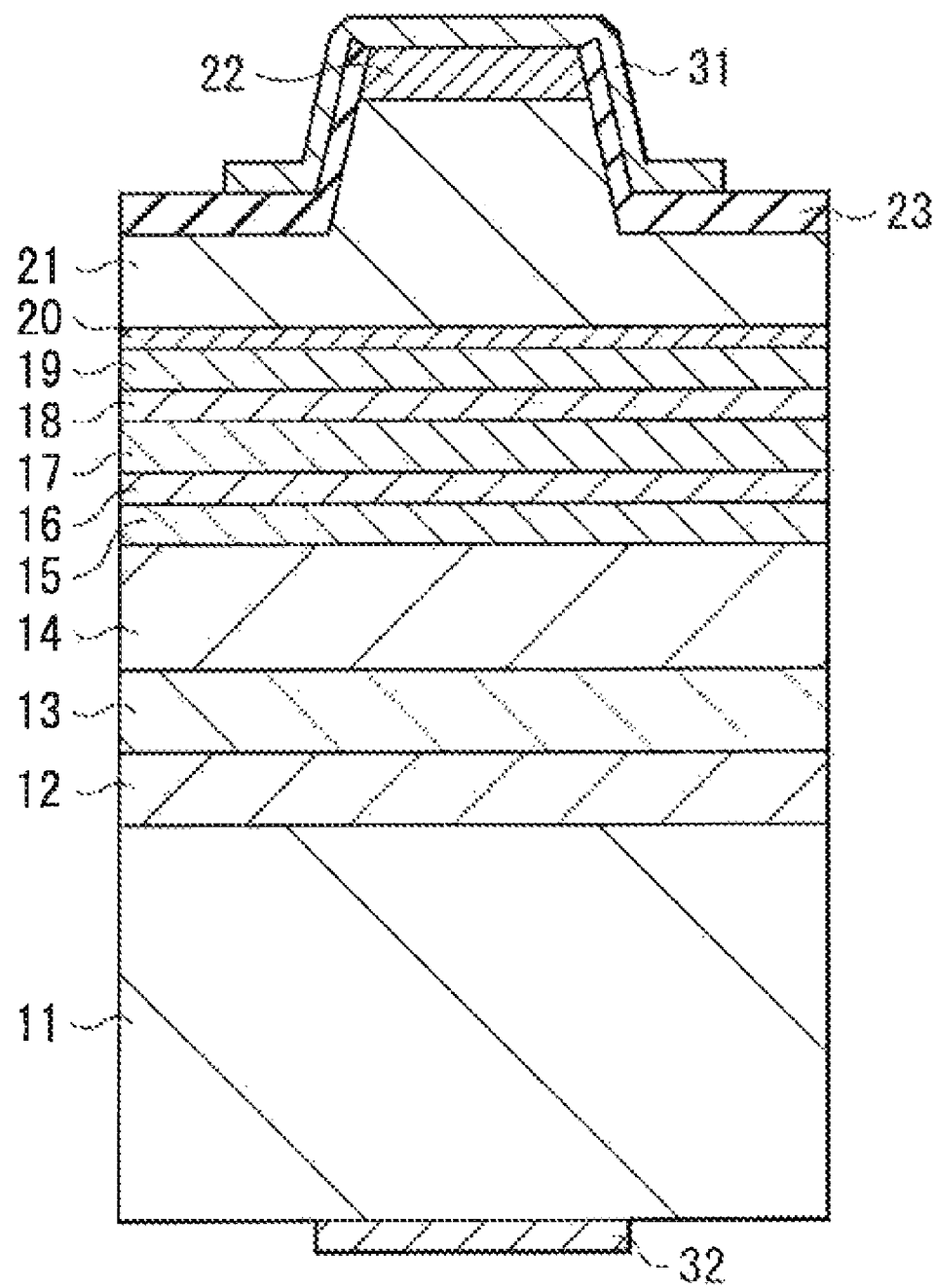
FIG. 1 is a cross sectional view illustrating a structure of a laser diode device according to an embodiment of the invention.

FIG. 1 illustrates a vertical cross sectional structure of a laser diode device according to an embodiment of the invention. The laser diode device is a blue/blue-violet laser diode device having an oscillation wavelength of about 500 nm or less, for example, around 400 nm that is used for, for example, a BD recording/reproducing laser of a personal computer, a home-use game machine and the like. For example, the laser diode device has a structure in which a codoped layer 13, a first n-type cladding layer 14, a second n-type cladding layer 15, an n-type guiding layer 16, an n-side intermediate layer 17, an active layer 18, a p-side intermediate layer 19, an electron barrier layer 20, a p-type cladding layer 21, and a p-side contact layer 22 are layered in this order on one face side of a substrate 11 composed of GaN with a buffer layer 12 in between.

The buffer layer 12 is, for example, 1.00 μm thick, and is composed of n-type GaN doped with silicon (Si) as n-type impurity.

The codoped layer 13 is intended to absorb light exuded to the substrate 11 side thorough the second n-type cladding layer 15 and the first n-type cladding layer 14. The codoped layer 13 is provided adjacent to the first n-type cladding layer 14, and has a forbidden band narrower than that of the first n-type cladding layer 14 and the second n-type cladding layer 15. The codoped layer 13 is composed of, for example, nitride Group III-V compound semiconductor containing at least gallium (Ga) out of Group 3B elements and at least nitrogen (N) out of Group 5B elements, and is codoped with one of silicon (Si) and germanium (Ge) as impurity working as a donor and one of magnesium (Mg) and zinc (Zn) as impurity working as an acceptor. Thereby, in the laser diode device, it is possible to inhibit mode coupling between light exuded to the substrate 11 side and light wave-guided through the active layer 18.

Examples of component materials of the codoped layer 13 include GaN and InGaN mixed crystal. Specially, GaN is preferable. In the case where InGaN mixed crystal is used, though absorption coefficient is able to be increased, optimal composition control is difficult, and there is a possibility to affect crystallinity of the first n-type cladding layer 14.

Figure 2:
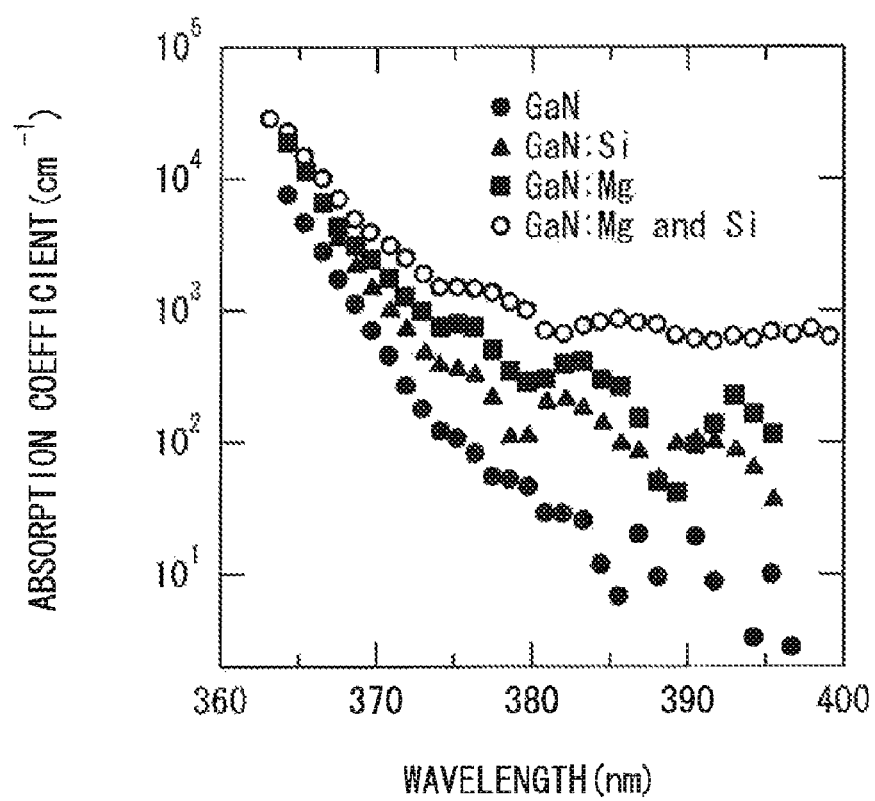
FIG. 2 is a diagram illustrating a result of examining each absorption spectrum of an undoped GaN layer not doped with impurity, a GaN layer doped with silicon (Si), a GaN layer doped with magnesium (Mg), and a GaN layer codoped with silicon (Si) and magnesium (Mg)

FIG. 2 illustrates a result of examining each absorption spectrum of an undoped GaN layer not doped with impurity, a GaN layer doped with silicon (Si), a GaN layer doped with magnesium (Mg), and a GaN layer codoped with silicon (Si) and magnesium (Mg). Table 1 summarizes each dopant concentration and each absorption coefficient in wavelength of 400 nm of each sample (refer to Nonpatent document 5).

TABLE 1

| Sample | Dopant concentration ($cm^{-3}$) | | Absorption coefficient in 400 nm ($cm^{-1}$) |
|---|---|---|---|
| | Si | Mg | |
| Undoped GaN | — | — | up to 10 |
| GaN doped with Si | $2*10^{18}$ | — | up to 30 |
| GaN doped with Mg | — | $4*10^{19}$ | up to 100 |
| GaN codoped with Si and Mg | $5*10^{18}$ | $4*10^{19}$ | up to 700 |

As evidenced by FIG. 2 and Table 1, in the GaN layer codoped with silicon (Si) and magnesium (Mg), the absorption coefficient was significantly higher than that of other samples doped with single impurity.

Accordingly, it is found that in the case where the codoped layer 13 is provided between the substrate 11/the buffer layer 12 and the first n-type cladding layer 14, light exuded to the substrate 11 side through the second n-type cladding layer 15 and the first n-type cladding layer 14 is able to be absorbed without increasing the thickness of the first n-type cladding layer 14 and the second n-type cladding layer 15. Further, the light absorption amount is able to be prevented from being excessively large by adjusting the thickness of the codoped layer 13 and the additive concentration of impurity. Thus, the threshold current or the operating current is able to be prevented from being increased. However, the thickness of the codoped layer 13 is preferably 500 nm or less. If the thickness of the codoped layer 13 is 500 nm or more, crystallinity may be disturbed by codoping.

The conduction type of the codoped layer 13 is preferably n type. The carrier concentration of the codoped layer 13 is preferably from $2.0*10^{17}$ ($cm^{-3}$) to $1.0*10^{19}$ ($cm^{-3}$) both inclusive. The carrier concentration of $2.0*10^{17}$ ($cm^{-3}$) corresponds to the lower limit value at which carrier necessary for realizing inverted population is able to be generated. The value of $1.0*10^{19}$ ($cm^{-3}$) corresponds to the upper limit value of the carrier concentration capable of being generated in the case where the codoped layer 13 is doped with impurity in the range where crystallinity and optical characteristics are not affected.

The additive concentration of impurity working as an acceptor (for example, magnesium (Mg)) of the codoped layer 13 is preferably from $1.0*10^{17}$ ($cm^{-3}$) to $4.0*10^{19}$ ($cm^{-3}$) both inclusive. It has been known that in the case where magnesium (Mg) is added to GaN, the relation between the additive concentration of magnesium (Mg) and the carrier concentration becomes as follows. If the additive concentration of magnesium (Mg) is $4.0*10^{19}$ ($cm^{-3}$) or less, as the additive concentration of magnesium (Mg) is increased, the carrier concentration is increased. When the additive concentration of magnesium (Mg) is $4.0*10^{19}$ ($cm^{-3}$), the carrier concentration becomes the highest value. If the additive concentration of magnesium (Mg) is more than $4.0*10^{19}$ ($cm^{-3}$), the carrier concentration becomes gradually decreased. The phenomenon that the carrier concentration is saturated or decreased at the time of a certain impurity additive concentration is also shown in other compound semiconductor. Further, if impurity is added until the time when saturation or decrease of the carrier concentration is shown, crystallinity is lowered. Accordingly, the upper limit value of the additive concentration of impurity working as an acceptor of the codoped layer 13 is preferably $4.0*10^{19}$ ($cm^{-3}$). The additive concentration is adjusted so that a desired absorption amount is obtained in the range from the lower limit value to the upper limit value. Specifically, about $5.0*10^{18}$ ($cm^{-3}$) is able to be realized. The same is applied to a case that zinc (Zn) is added as impurity working as an acceptor.

Figure 3:
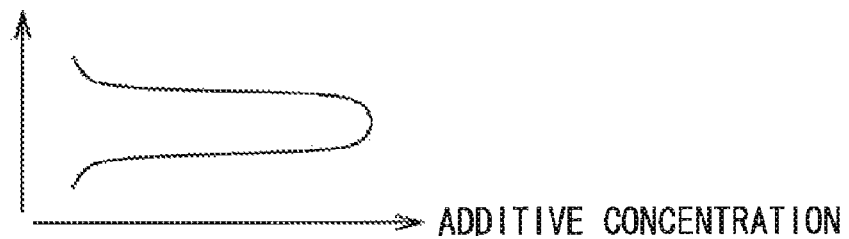
FIG. 3 is a diagram illustrating an example of a distribution of an additive concentration of impurity working as an acceptor of the codoped layer illustrated in FIG. 1.

The additive concentration of impurity working as an acceptor of the codoped layer 13 may be uniform in the thickness direction of the codoped layer 13, but the additive concentration may be gradually increased, or may be gradually decreased. Specifically, as illustrated in FIG. 3, the additive concentration of impurity working as an acceptor in both ends in the thickness direction of the codoped layer 13 (in the vicinity of the interface with the substrate 11 or in the vicinity of the interface with the first n-type cladding layer 14) is preferably lower than the additive concentration of impurity working as an acceptor in the center in the thickness direction of the codoped layer 13. Thereby, the impurity working as an acceptor (for example, magnesium) is prevented from being dispersed in the substrate 11 or the first n-type cladding layer 14.

The additive concentration of impurity working as a donor (for example, silicon (Si)) of the codoped layer 13 is preferably from $1.0*10^{17}$ (cm$^{-3}$) to $1.0*10^{19}$ (cm$^{-3}$) both inclusive. It is necessary that impurity working as a donor to show n-type conductivity (for example, silicon (Si)) is added to the codoped layer 13. The additive concentration of silicon (Si) is determined by a relation with the additive concentration of impurity working as an acceptor (for example, magnesium (Mg)) to be codoped. The impurity working as a donor should be added so that the carrier concentration of the codoped layer 13 becomes from $2.0*10^{17}$ (cm$^{-3}$) to $1.0*10^{19}$ (cm$^{-3}$) both inclusive. Specifically, the additive concentration of impurity working as a donor is able to be about $2.0*10^{18}$ (cm$^{-3}$).

It is preferable that the first n-type cladding layer 14 and the second n-type cladding layer 15 illustrated in FIG. 1 are respectively composed of, for example, $Al_xGa_{1-x}N$ ($0<x\leqq1$) mixed crystal having a composition different from each other, and have a thickness not exceeding the crack generation critical film thickness to given aluminum composition ratio x. Thereby, crack is able to be prevented from being generated in the first n-type cladding layer 14 and the second n-type cladding layer 15, and productivity is able to be improved by shortening growth time. Further, there is an advantage that series resistance is able to be lowered by decreasing the thickness of the first n-type cladding layer 14 and the second n-type cladding layer 15.

Figure 4:
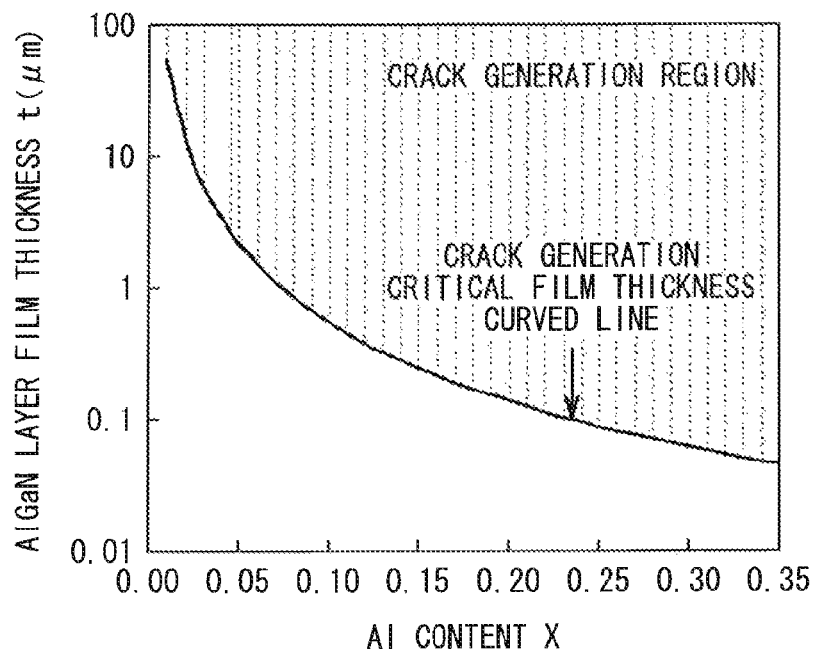
FIG. 4 is a diagram illustrating a relation between aluminum composition ratio x of an $Al_xGa_{1-x}N$ ($0<x\leq1$) mixed crystal layer and a crack generation critical film thickness.

FIG. 4 illustrates a relation between the aluminum composition ratio x of an $Al_xGa_{1-x}N$ ($0<x\leqq1$) mixed crystal layer and a crack generation critical film thickness, which is calculated based on "Journal of Applied Physics," 2000, December, Vol. 88, No. 12, pp. 7029 to 7036. The upper region of the crack generation critical film thickness curved line is a crack generation region. The lower region thereof is a region in which the AlGaN layer is able to be grown without generating a crack. For example, the aluminum composition ratio x is desirably 0.045, and thickness t is desirably from 2.5 μm to 2.6 μm both inclusive.

Specifically, for example, the first n-type cladding layer 14 is 2.40 μm thick, and is composed of n-type $Al_{0.03}Ga_{0.97}N$ mixed crystal doped with silicon (Si) as n-type impurity. The second n-type cladding layer 15 is, for example, 0.20 μm thick, and is composed of n-type $Al_{0.01}Ga_{0.99}N$ mixed crystal doped with silicon (Si) as n-type impurity. The aluminum composition ratio of the first n-type cladding layer 14 is different from the aluminum composition ratio of the second n-type cladding layer 15 in order to prevent characteristics lowering by shifting light intensity peak generated in the active layer 18 to the first n-type cladding layer 14 side.

The n-type guiding layer 16 illustrated in FIG. 1 is, for example, 0.21 μm thick, and is composed of n-type GaN doped with silicon (Si) as n-type impurity. The n-side intermediate layer 17 illustrated in FIG. 1 is, for example, 0.005 μm thick, and is composed of undoped GaInN mixed crystal not doped with impurity.

The active layer 18 illustrated in FIG. 1 is, for example, 0.056 μm thick, and has a multiquantum well structure composed of a well layer and a barrier layer that are respectively formed from $Ga_xIn_{1-x}N$ ($x\geqq0$) mixed crystal having a composition different from each other.

The p-side intermediate layer 19 illustrated in FIG. 1 is, for example, 0.027 μm thick, and is composed of undoped GaInN mixed crystal not doped with impurity. The electron barrier layer 20 illustrated in FIG. 1 is, for example, 0.02 μm thick, and is composed of p-type AlGaN mixed crystal doped with magnesium (Mg) as p-type impurity. The p-type cladding layer 21 illustrated in FIG. 1 is, for example, 0.38 μm thick, and has a superlattice structure composed of p-type AlGaN mixed crystal layer doped with magnesium (Mg) as p-type impurity and a p-type GaN layer. The p-side contact layer 22 illustrated in FIG. 1 is, for example, 0.10 μm thick, and is composed of p-type GaN doped with magnesium (Mg) as p-type impurity.

On the p-side contact layer 22 illustrated in FIG. 1, a p-side electrode 31 is formed with a buried layer 23 having a laminated structure composed of an $SiO_2$ layer and an Si layer in between. The p-side electrode 31 has, for example, a structure in which palladium (Pd), platinum (Pt), and gold (Au) are sequentially layered from the p-side contact layer 22 side, and is electrically connected to the p-side contact layer 22. The p-side electrode 31 is extended in the shape of a strip for current confinement. The region of the active layer 18 corresponding to the p-side electrode 31 is a light emitting region. Meanwhile, on the rear face of the substrate 11, an n-side electrode 32 is formed. The n-side electrode 32 has, for example, a structure in which titanium (Ti), platinum (Pt), and gold (Au) are sequentially layered. The n-side electrode 32 is electrically connected to the first n-type cladding layer 14 with the substrate 11, the buffer layer 12, and the codoped layer 13 in between.

In the laser diode device, for example, a pair of side faces opposed to each other in the longitudinal direction of the p-side electrode 31 is a pair of resonator end faces. On the pair of resonator end faces, a pair of reflecting mirror films (not illustrated) is respectively formed. Of the pair of reflecting mirror films, one reflecting mirror film is adjusted to have lower reflectance, and the other reflecting mirror film is adjusted to have higher reflectance. Thereby, light generated in the active layer 18 shuttles between the pair of reflecting mirror films, is amplified, and is emitted as a laser beam from the said one reflecting mirror film.

The laser diode is able to be manufactured, for example, as follows.

First, for example, the substrate 11 composed of GaN is prepared. On the surface of the substrate 11, for example, by MOCVD (Metal Organic Chemical Vapor Deposition) method, the buffer layer 12 made of the foregoing material is grown.

Next, by MOCVD method again, the codoped layer 13 is grown. At this time, gallium raw material gas and nitrogen raw material gas are supplied, silicon raw material gas and magnesium raw material gas are supplied, and thereby the codoped layer 13 that is codoped with silicon as impurity working as a donor and magnesium as impurity working as an acceptor is formed.

Subsequently, by MOCVD method again, the first n-type cladding layer 14, the second n-type cladding layer 15, the n-type guiding layer 16, the n-side intermediate layer 17, the active layer 18, the p-side intermediate layer 19, the electron barrier layer 20, the p-type cladding layer 21, and the p-side contact layer 22 that are made of the foregoing material are grown.

In performing MOCVD, for example, trimethyl gallium (($CH_3$)$_3$Ga) as gallium raw material gas, for example, trimethyl aluminum (($CH_3$)$_3$Al) as aluminum raw material gas, for example, trimethyl indium (($CH_3$)$_3$In) as indium raw material gas, and for example, ammonia ($NH_3$) as nitrogen raw material gas are respectively used. Further, for example, silane ($SiH_4$) is used as silicon raw material gas, and, for example, bis=cyclopentadienyl magnesium (($C_5H_5$)$_2$Mg) is used as magnesium raw material gas.

Next, a mask (not illustrated) is formed on the p-side contact layer 22. By using the mask, the p-side contact layer 22 and part of the p-type cladding layer 21 are selectively etched by, for example, RIE (Reactive Ion Etching) method to form the upper section of the p-type cladding layer 21 and the p-side contact layer 22 into the strip-shaped protruding streak section.

Subsequently, on the p-type cladding layer 21 and the p-side contact layer 22, the buried layer 23 made of the foregoing material is formed. In the buried layer 23, an aperture is provided correspondingly to the p-side contact layer 22 to form the p-side electrode 31. Further, the rear face side of the substrate 11 is, for example, lapped or polished so that the thickness of the substrate 11 becomes, for example, about 100 μm. After that, the n-side electrode 32 is formed on the rear face of the substrate 11. After that, the substrate 11 is formed into a given size, and the reflecting mirror films (not illustrated) are formed on the pair of opposed resonator end faces. Accordingly, the laser diode device illustrated in FIG. 1 is completed.

In the laser diode, in the case where a given voltage is applied between the n-side electrode 32 and the p-side electrode 31, a current is injected into the active layer 18, and light is emitted by electron-hole recombination. The light is reflected by the pair of reflecting mirror films, shuttles in between, generates laser oscillation, and is radiated outside as a laser beam. In this embodiment, the codoped layer 13 composed of GaN codoped with one of silicon (Si) and germanium (Ge) as impurity working as a donor and one of magnesium (Mg) and zinc (Zn) as impurity working as an acceptor is provided between the substrate 11/the buffer layer 12 and the first n-type cladding layer 14. Thus, light exuded to the substrate 11 side through the second n-type cladding layer 15 and the first n-type cladding layer 14 is absorbed in the codoped layer 13, and is decayed down to the degree with which mode coupling with light wave-guided through the active layer 18 is not generated. Accordingly, ripple is not observed in FFP, and stable laser oscillation is enabled.

Figure 5:
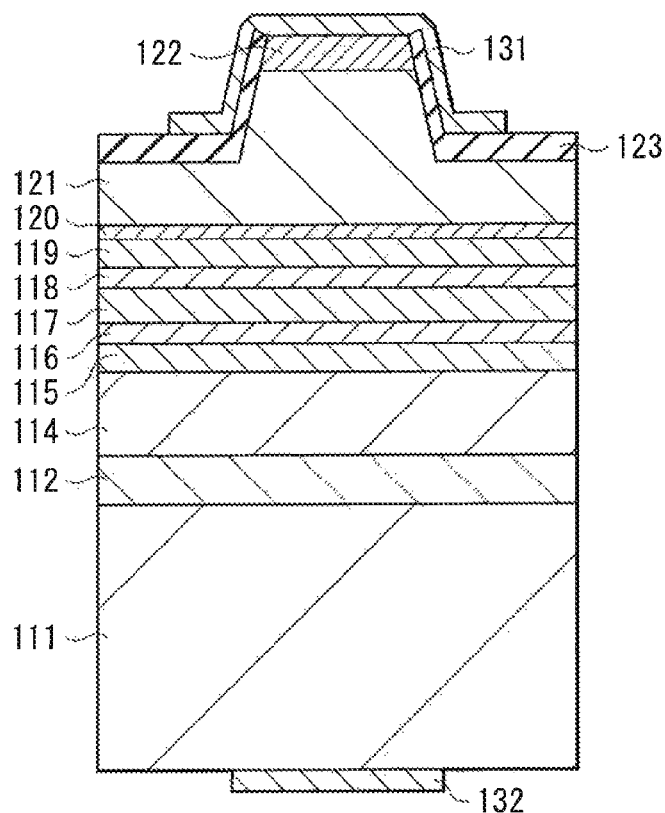
FIG. 5 is a cross sectional view illustrating a structure of an existing laser diode device.

FIG. 5 illustrates a cross sectional structure of an existing nitride compound laser diode device. The existing nitride compound laser diode device has the same structure as that of the laser diode device of this embodiment, except that the codoped layer is not included. Thus, for the same elements as those of FIG. 1, referential numbers obtained by adding 100 to the corresponding elements of FIG. 1 are affixed thereto, and the descriptions thereof will be omitted.

Figure 6:
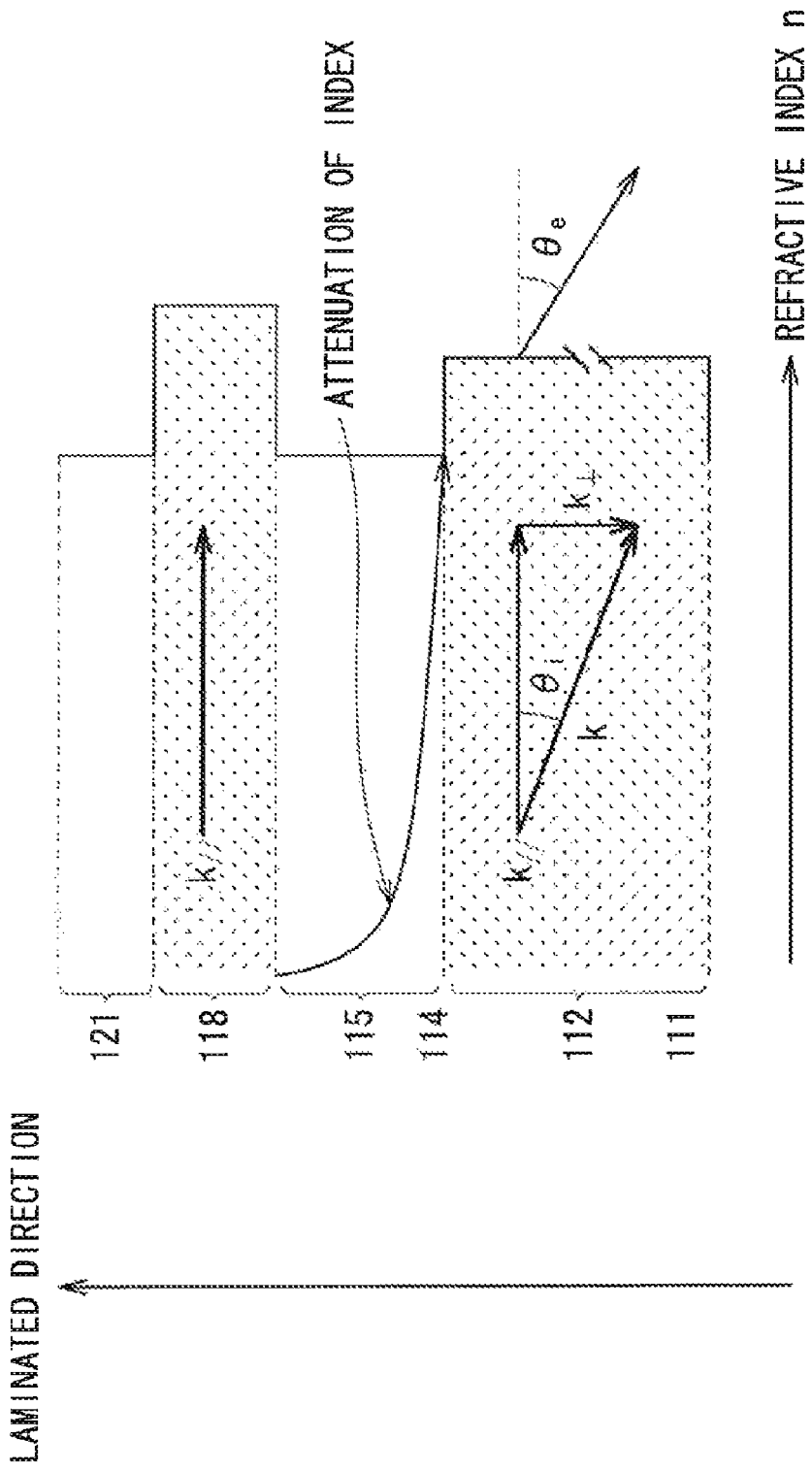
FIG. 6 is a diagram illustrating a refractive index distribution in a vertical structure of the existing laser diode device illustrated in FIG. 5.

FIG. 6 illustrates a refractive index distribution in a vertical structure of the existing laser diode device illustrated in FIG. 5. The refractive index of a substrate 111 composed of GaN and a buffer layer 112 composed of n-type GaN is 2.52, the refractive index of a first n-type cladding layer 114 composed of $Al_{0.03}Ga_{0.97}N$ mixed crystal is 2.494, and the refractive index of a second n-type cladding layer 115 composed of $Al_{0.01}Ga_{0.99}N$ mixed crystal is 2.511. If effective refractive index neff in the vertical structure is calculated, 2.514 is obtained.

Light exuded to the substrate 111 side is exponentially decayed since the refractive index of the first n-type cladding layer 114 and the second n-type cladding layer 115 is lower than the effective refractive index neff (n<neff). However, outside the first n-type cladding layer 114 and the second n-type cladding layer 115, the buffer layer 112 and the substrate 111 having higher refractive index than that of the first n-type cladding layer 114 and the second n-type cladding layer 115 exist. Thus, evanescent wave k passing through the first n-type cladding layer 114 and the second n-type cladding layer 115 enters at incident angle θi, and is wave-guided through the buffer layer 112 and the substrate 111.

At this time, it is able to be regarded that two waveguides exist in the laser diode device. One thereof is a waveguide centering on the active layer 118 (active waveguide), and the other thereof is the buffer layer 112 and the substrate 111 (passive waveguide).

The evanescent wave k is expressed by Mathematical formula 1, component k// in parallel with a waveguide of the evanescent wave k is expressed by Mathematical formula 2, and component k⊥ perpendicular to the waveguide of the evanescent wave k is expressed by Mathematical formula 3 respectively.

$$k = 2\pi n_{GaN}/\lambda_0 \qquad \text{Mathematical formula 1}$$

In the formula, $\lambda_0$ represents a wavelength in vacuum, and nGaN represents refractive index of the substrate 111.

$$k// = 2\pi n_{eff}/\lambda_0 = k \cos \theta_i \qquad \text{Mathematical formula 2}$$

In the formula, $\lambda_0$ represents a wavelength in vacuum, and neff represents effective refractive index.

$$k\bot = k \sin \theta_i \qquad \text{Mathematical formula 3}$$

In the case where the component k// in parallel with the waveguide of the evanescent wave k becomes equal to the light k// wave-guided through the active layer 18, mode coupling is generated between the active waveguide centering on the active layer 118 and the passive waveguide formed in the buffer layer 112 and the substrate 111 is generated, spike light is emitted at output angle $\theta_e$ shown in Mathematical formula 4 from the buffer layer 112 or the substrate 111. The spike light causes generation of ripple in FFP, affecting light collection characteristics and laser characteristics.

$$n_{GaN} \sin \theta_i = \sin \theta_e \qquad \text{Mathematical formula 4}$$

By providing the codoped layer 13 as in this embodiment, the evanescent wave k that has passed through the second n-type cladding layer 15 and the first n-type cladding layer 14 is able to be absorbed into the codoped layer 13. Thus, light is able to be inhibited from being exuded to the substrate 11 side without increasing the thickness of the first n-type cladding layer 14 and the second n-type cladding layer 15. In addition, mode coupling between the active waveguide centering on the active layer 18 and the passive waveguide formed by the evanescent wave k exuded to the substrate 11 side is able to be inhibited, and stable laser oscillation is enabled.

As described above, in this embodiment, the codoped layer 13 composed of GaN codoped with one of silicon (Si) and germanium (Ge) as impurity working as a donor and one of magnesium (Mg) and zinc (Zn) as impurity working as an acceptor is provided between the substrate 11/the buffer layer 12 and the first n-type cladding layer 14. Thus, light exuded to the substrate 11 side through the second n-type cladding layer 15 and the first n-type cladding layer 14 is able to be absorbed in the codoped layer 13. Accordingly, mode coupling between the light exuded to the substrate 11 side and light wave-guided through the active layer 18 is able to be inhibited.

Descriptions have been hereinbefore given of the invention with reference to the embodiment. However, the invention is not limited to the foregoing embodiment, and various modifications may be made. For example, the material, the thickness, the film formation methods, the film formation conditions and the like of the respective layers described in the foregoing embodiment are not limited, but other material, other thickness, other film formation method, and other film formation conditions may be used. For example, in the foregoing embodiment, the description has been given of the case that the buffer layer 12 and the p-side contact layer 22 are formed by MOCVD method. However, the buffer layer 12 and the p-side contact layer 22 may be formed by other organic metal vapor-phase deposition method such as MOVPE method, or MBE (Molecular Beam Epitaxy) method or the like may be used.

In addition, for example, in the foregoing embodiment, the structure of the laser diode device has been described with the specific example. However, it is not necessary to provide all layers, or other layer may be further provided.

Furthermore, the invention is not limited to the blue/blue-violet laser diode, but is able to be applied to a higher output laser diode, a laser diode having other oscillation, or a laser diode made of other material system.

The present application contains subject matter related to that disclosed in Japanese Priority Patent Application JP 2009-058249 filed in the Japan Patent Office on Mar. 11, 2009, the entire content of which is hereby incorporated by reference.

It should be understood by those skilled in the art that various modifications, combinations, sub-combinations and alternations may occur depending on design requirements and other factors insofar as they are within the scope of the appended claims or the equivalents thereof.

What is claimed is:

1. A laser diode device comprising:
   a substrate composed of GaN;
   an n-type cladding layer and a p-type cladding layer that are provided on one side of the substrate and that are composed of nitride Group III-V compound semiconductor containing at least gallium (Ga) out of Group 3B elements and at least nitrogen (N) out of Group 5B elements, and contain aluminum (Al) at least in part;
   an active layer that is provided between the n-type cladding layer and the p-type cladding layer and that is composed of nitride Group III-V compound semiconductor containing at least indium (In) and gallium (Ga) out of Group 3B elements and at least nitrogen (N) out of Group 5B elements; and
   a co-doped layer that is provided between the substrate and the n-type cladding layer and that is composed of nitride Group III-V compound semiconductor containing at least gallium (Ga) out of Group 3B elements and at least nitrogen (N) out of Group 5B elements, and is co-doped with one of silicon (Si) and germanium (Ge) as impurity working as a donor and one of magnesium (Mg) and zinc (Zn) as impurity working as an acceptor,
   wherein,
      the co-doped layer is provided adjacent to the n-type cladding layer without an intervening layer in-between, and has a narrower forbidden band than that of the n-type cladding layer.

2. The laser diode device according to claim 1, wherein a carrier concentration of the co-doped layer is from $1.0*10^{18}$ $(cm^{-3})$ to $1.0*10^{19}$ $(cm^{-3})$ both inclusive.

3. The laser diode device according to claim 1, wherein the n-type cladding layer is composed of $Al_xGa_{1-x}N$ ($0<x\leqq1$) mixed crystal, and has a thickness not exceeding a crack generation critical film thickness to a given aluminum composition ratio x.

4. The laser diode device according to claim 1, wherein the co-doped layer has a thickness of 500 nm or less.

5. The laser diode device according to claim 1, wherein an additive concentration of the impurity working as an acceptor of the co-doped layer is from $1.0*10^{17}$ $(cm^{-3})$ to $4.0*10^{19}$ $(cm^{-3})$ both inclusive.

6. The laser diode device according to claim 1, wherein the co-doped layer is co-doped with at least Ge as impurity working as a donor and at least Zn as impurity working as an acceptor.

7. A laser diode device comprising:
   a substrate composed of GaN;
   an n-type cladding layer and a p-type cladding layer that are provided on one side of the substrate and that are composed of nitride Group III-V compound semiconductor containing at least gallium (Ga) out of Group 3B elements and at least nitrogen (N) out of Group 5B elements, and contain aluminum (Al) at least in part;
   an active layer that is provided between the n-type cladding layer and the p-type cladding layer and that is composed of nitride Group III-V compound semiconductor containing at least indium (In) and gallium (Ga) out of Group 3B elements and at least nitrogen (N) out of Group 5B elements; and
   a co-doped layer that is provided between the substrate and the n-type cladding layer and that is composed of nitride Group III-V compound semiconductor containing at least gallium (Ga) out of Group 3B elements and at least nitrogen (N) out of Group 5B elements, and is co-doped with one of silicon (Si) and germanium (Ge) as impurity working as a donor and one of magnesium (Mg) and zinc (Zn) as impurity working as an acceptor,
   wherein,
      a conductivity type of the co-doped layer is n-type, and the co-doped layer is provided adjacent to the n-type cladding layer without an intervening layer in-between, and has a narrower forbidden band than that of the n-type cladding layer.

* * * * *